(12) United States Patent
Ren et al.

(10) Patent No.: US 11,159,246 B2
(45) Date of Patent: Oct. 26, 2021

(54) GRATING- AND FIBER-COUPLED MULTI-BEAM COHERENT RECEIVING SYSTEM IN MID- AND FAR-INFRARED BAND

(71) Applicant: Purple Mountain Observatory, Chinese Academy of Sciences, Nanjing (CN)

(72) Inventors: Yuan Ren, Nanjing (CN); Shengcai Shi, Nanjing (CN); Daixi Zhang, Nanjing (CN)

(73) Assignee: PURPLE MOUNTAIN OBSERVATORY, CHINESE ACADEMY OF SCIENCES, Nanjing (CN)

( * ) Notice: Subject to any disclaimer, the term of this patent is extended or adjusted under 35 U.S.C. 154(b) by 0 days.

(21) Appl. No.: 17/263,163

(22) PCT Filed: Jul. 16, 2020

(86) PCT No.: PCT/CN2020/102301
§ 371 (c)(1),
(2) Date: Jan. 26, 2021

(87) PCT Pub. No.: WO2021/008407
PCT Pub. Date: May 14, 2021

(65) Prior Publication Data
US 2021/0266073 A1 Aug. 26, 2021

(30) Foreign Application Priority Data
Nov. 5, 2019 (CN) .......................... 201911068651.3

(51) Int. Cl.
*H04B 10/61* (2013.01)

(52) U.S. Cl.
CPC ....... *H04B 10/6164* (2013.01); *H04B 10/615* (2013.01)

(58) Field of Classification Search
CPC .......................... H04B 10/6164; H04B 10/615
See application file for complete search history.

(56) References Cited

U.S. PATENT DOCUMENTS

| | | | | |
|---|---|---|---|---|
| 7,376,403 B1 * | 5/2008 | Wanke | .................. | H01L 29/205 257/19 |
| 8,748,822 B1 * | 6/2014 | Gerecht | ............. | G01N 21/3586 250/339.07 |

(Continued)

FOREIGN PATENT DOCUMENTS

| CN | 101126775 A | 2/2008 |
|---|---|---|
| CN | 102052967 A | 5/2011 |

(Continued)

*Primary Examiner* — Mina M Shalaby
(74) *Attorney, Agent, or Firm* — Bayramoglu Law Offices LLC

(57) ABSTRACT

A grating- and fiber-coupled multi-beam coherent receiving system in a mid- and far-infrared band includes a mid- and far-infrared local oscillator signal source, a phase grating, a multi-beam fiber coupling system, a 2×2 pixel mid- and far-infrared superconducting HEB mixer, a multi-channel DC bias source, a multi-channel cryogenic low-noise amplifier, and a room-temperature intermediate-frequency and high-resolution spectrum processing unit. In a 2×2 multi-beam superconducting receiving system, an echelle grating and a cryogenic optical fiber are used to distribute and couple the local oscillator signal, and the mid- and far-infrared band high-sensitivity superconducting HEB mixer is used to realize efficient local oscillator signal distribution and coupling, and ultimately achieve high-sensitivity and high-resolution multi-beam spectrum reception in the mid- and far-infrared band.

8 Claims, 2 Drawing Sheets

(56) References Cited

U.S. PATENT DOCUMENTS

| | | | |
|---|---|---|---|
| 9,002,215 B2 | 4/2015 | Khatana | |
| 9,366,574 B2* | 6/2016 | Pereverzev | G01J 3/021 |
| 9,735,885 B1 | 8/2017 | Sayyah et al. | |
| 2006/0198404 A1* | 9/2006 | Henrichs | B82Y 20/00 |
| | | | 372/29.02 |
| 2012/0181431 A1* | 7/2012 | Mitin | G01N 21/3581 |
| | | | 250/338.4 |
| 2014/0320864 A1* | 10/2014 | Liao | G01S 17/00 |
| | | | 356/486 |
| 2017/0138791 A1* | 5/2017 | Burghoff | G01J 3/108 |
| 2017/0214217 A1* | 7/2017 | Peale | H01S 5/1071 |

FOREIGN PATENT DOCUMENTS

| | | |
|---|---|---|
| CN | 103134983 A | 6/2013 |
| CN | 104458645 A | 3/2015 |
| CN | 105510724 A | 4/2016 |
| CN | 106100754 A | 11/2016 |
| CN | 106772838 A | 5/2017 |
| CN | 109728857 A | 5/2019 |
| CN | 110768729 A | 2/2020 |

* cited by examiner

GRATING- AND FIBER-COUPLED MULTI-BEAM COHERENT RECEIVING SYSTEM IN MID- AND FAR-INFRARED BAND

CROSS REFERENCE TO THE RELATED APPLICATIONS

This application is the national phase entry of International Application No. PCT/CN2020/102301, filed on Jul. 16, 2020, which is based upon and claims priority to Chinese Patent Application No. 201911068651.3, filed on Nov. 5, 2019, the entire contents of which are incorporated herein by reference.

TECHNICAL FIELD

The present invention relates to the technical field of multi-beam coherent detection, and in particular, to a multi-beam coherent receiving system based on a grating- and fiber-coupled local oscillator signal in a mid- and far-infrared frequency band.

BACKGROUND

High-resolution spectral line observation in the far-infrared and mid-infrared frequency bands (4-20 m) is of great significance for studying the state and evolution of the universe, including the evolution of the early universe, the formation of stars and galaxies, and the formation of planetary systems. It is irreplaceable in research of modern astronomy. A high-resolution coherent receiving system can not only accurately detect the signal intensity of a molecular spectrum, but it can also clearly identify the spectrum information of each spectrum, so as to provide an important scientific means for systematically studying the movement, temperature and other physical properties during the formation of stars and galaxies and the formation of planets and planetary systems.

Internationally, high-resolution spectrum receivers based on the mid-infrared band only include: Heterodyne Instrument for Planetary Wind and Composition (HIPWAC) developed by NASA in US and Infrared Compact Heterodyne Instrument for Planetary Science (iCHIPS) developed by the University of Cologne in Germany. Either of the two instruments uses a mercury cadmium telluride (HgCdTe) detector as a mixer and a quantum cascade laser (QCL) as a local oscillator signal source. In 2019, the research team of the Purple Mountain Observatory took the lead in realizing a mid-infrared coherent receiving system using a superconducting hot-electron bolometer (HEB) and a quantum cascade laser. The above coherent receiving systems each use a single-pixel mixer, and use an optical splitter (generally including Mylar, Kapton film, and wire grid) to couple the local oscillator signal and the detection signal to the mixer.

We know that multi-beam coherent detection technology has been widely used in the fields of astronomical observation, environmental monitoring and security inspection in the terahertz frequency band, such as Heterodyne Array Receiver Programme (HARP)-B (4×4 beam) of James Clerk Maxwell Telescope (JCMT) and receiver (5×5 beam) of Koelner Observatory for Submillimeter Astronomy (KOSMA) telescope, SuperCam (8×8 beam) of Heinrich Hertz Telescope (HHT) and superconducting array imaging spectrometer (3×3 beam) of China's 13.7 meter millimeter-wave telescope. However, a multi-beam coherent receiving system in the mid- and far-infrared frequency band with higher frequency has not yet been reported. The key technical challenge lies in the local oscillator signal distribution technology between multiple pixels in the mid- and far-infrared frequency band. The local oscillator signal of the traditional single-pixel mid-infrared receiving system is coupled to the mixer through the optical splitter, and the optical splitter will inevitably increase the loss of the detection signal, thereby deteriorating the sensitivity of the mixer. In addition, it is difficult to achieve the local oscillator coupling requirements of the two-dimensional array through the cascade coupling of the optical splitter, and it is impossible to realize a large-scale pixel array receiving system.

SUMMARY

In view of the shortcomings in the prior art, the present invention provides a grating- and fiber-coupled multi-beam coherent receiving system in a mid- and far-infrared band.

In order to achieve the above objective, the present invention adopts the following technical solutions.

A grating- and fiber-coupled multi-beam coherent receiving system in a mid- and far-infrared band includes: a mid- and far-infrared local oscillator signal source, a phase grating, a multi-beam fiber coupling system, a 2×2 pixel mid- and far-infrared superconducting HEB mixer, a multi-channel direct current (DC) bias source, a multi-channel cryogenic low-noise amplifier and a room-temperature intermediate-frequency and high-resolution spectrum processing unit. The mid- and far-infrared local oscillator signal source generates a local oscillator signal and focuses on a surface of the phase grating. The phase grating reflects and separates the incident local oscillator signal into four reflected local oscillator signals with a 2×2 array. The four local oscillator signals are coupled to an end face of an optical fiber through the multi-beam fiber coupling system, and then transmitted to a side of the 2×2 pixel mid- and far-infrared superconducting HEB mixer in a cryogenic Dewar via the optical fiber to realize distribution and coupling of the local oscillator signal. The detection signal and the local oscillator signal are mixed by the 2×2 pixel mid- and far-infrared superconducting HEB mixer to generate four intermediate frequency signals. The four intermediate frequency signals are first amplified by the multi-channel cryogenic low-noise amplifier, and then subjected to a high-resolution spectrum processing through the room-temperature intermediate-frequency and high-resolution spectrum processing unit. The multi-channel DC bias source is connected to the 2×2 pixel mid- and far-infrared superconducting HEB mixer, and is used to provide DC bias to the 2×2 pixel mid- and far-infrared superconducting HEB mixer.

In order to optimize the above technical solution, the specific measures are further taken as follows.

Further, the 2×2 pixel mid- and far-infrared superconducting HEB mixer and the multi-channel cryogenic low-noise amplifier are located in a 4K closed-cycle cryostat.

Further, the mid- and far-infrared local oscillator signal source includes a quantum cascade laser and an off-axis parabolic mirror, the quantum cascade laser generates the local oscillator signal, and the local oscillator signal is focused on the surface of the phase grating after being reflected by the off-axis parabolic mirror.

Further, the phase grating adopts an echelle grating, and the local oscillator signal is focused on the surface of the echelle grating after being reflected by the off-axis parabolic mirror, and the echelle grating reflects and separates the incident local oscillator signal into four reflected local oscillator signals with a 2×2 array by adjusting a wavefront phase of a reflected signal.

Further, the multi-beam fiber coupling system includes a fiber coupler and a mid- and far-infrared optical fiber, and the four beams of the reflected local oscillator signals are coupled to the end face of the mid- and far-infrared optical fiber through the fiber coupler composed of a parabolic mirror.

Further, the 2×2 pixel mid- and far-infrared superconducting HEB mixer is a four-pixel superconducting HEB mixer array composed of four mid- and far-infrared superconducting HEB detectors. The 2×2 pixel mid- and far-infrared superconducting HEB mixer includes a super hemispherical lens and a mid- and far-infrared superconducting HEB mixer chip. The detection signal is coupled to the mid- and far-infrared superconducting HEB mixer chip by the super hemispherical lens. The local oscillator signal is coupled to the mid- and far-infrared superconducting HEB mixer chip from the end face of the mid- and far-infrared optical fiber through free space. The distance between the end face of the mid- and far-infrared optical fiber and the mid- and far-infrared superconducting HEB mixer chip is less than 1 mm.

Further, the echelle grating uses a Si substrate to perform a multilayer deep silicon etching, and uses an evaporated gold coating as a reflective multi-beam echelle grating.

Further, the mid- and far-infrared optical fiber adopts a polycrystalline fiber capable of working in a 4 k temperature zone.

The advantages of the present invention are as follows. The system does not need to use the super hemispherical lens of the superconducting HEB mixer to couple the local oscillator signal, but directly aligns the fiber output end to the side of the superconducting HEB mixer chip, realizing the isolation of the local oscillator signal from the detection signal, and effectively loading the local oscillator signal. This not only reduces the loss of the detection signal and improves the sensitivity of the receiving system, but it also realizes an effective and feasible multi-beam local oscillator distributing and loading system, which is easy to expand to a larger-scale array, and ultimately achieves high spectral resolution ($\lambda/\Delta\lambda>10^6$) and high sensitivity multi-beam signal detection in the mid- and far-infrared band.

DETAILED DESCRIPTION OF THE EMBODIMENTS

The present invention will now be described in further detail with reference to the drawings.

Figure 1:
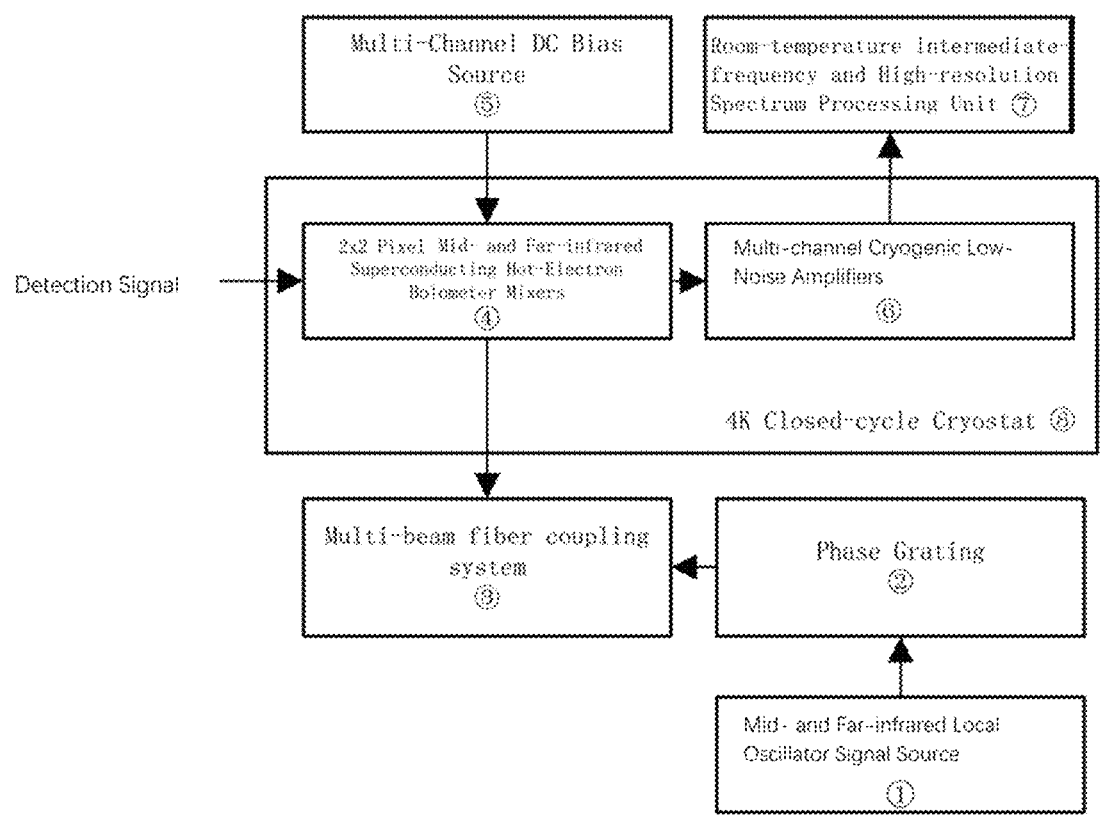
FIG. 1 is a system block diagram of the present invention.

As shown in FIG. 1, the grating- and fiber-coupled multi-beam coherent receiving system in a mid- and far-infrared band includes: the mid- and far-infrared local oscillator signal source 1, the phase grating 2, the multi-beam fiber coupling system 3, the 2×2 pixel mid- and far-infrared superconducting HEB mixer 4, the multi-channel DC bias source 5, the multi-channel cryogenic low-noise amplifier 6 and the room-temperature intermediate-frequency and high-resolution spectrum processing unit 7. The mid- and far-infrared band (4-20 m) local oscillator signal source adopts the quantum cascade laser. The 2×2 beam echelle grating adopts a Si substrate for a multilayer deep silicon etching, and an evaporated gold coating is used as a reflective multi-beam echelle grating. The fiber coupler uses an off-axis parabolic mirror to couple a free-space beam to the end face of the optical fiber. The mid-infrared cryogenic optical fiber uses the polycrystalline fiber (polycrystalline AgCl: AgBr fiber) that can work in a 4 k temperature zone. The detector uses the superconducting HEB mixer. The cryogenic low-noise amplifier uses a low-noise amplifier with integrated monolithic microwave integrated circuit (MMIC) technology. The room-temperature intermediate-frequency and high-resolution spectrum processing unit adopts high-resolution digital spectrum technology. The layout of the 2×2 beam superconducting detector adopts a square array that is easy to implement in technology. At the same time, the structure is compact, and the main beam of the far-field radiation pattern of the antenna (integrated in the superconducting detector) of each pixel does not overlap to ensure minimal interference of the received signal by adjacent pixels.

Figure 2:
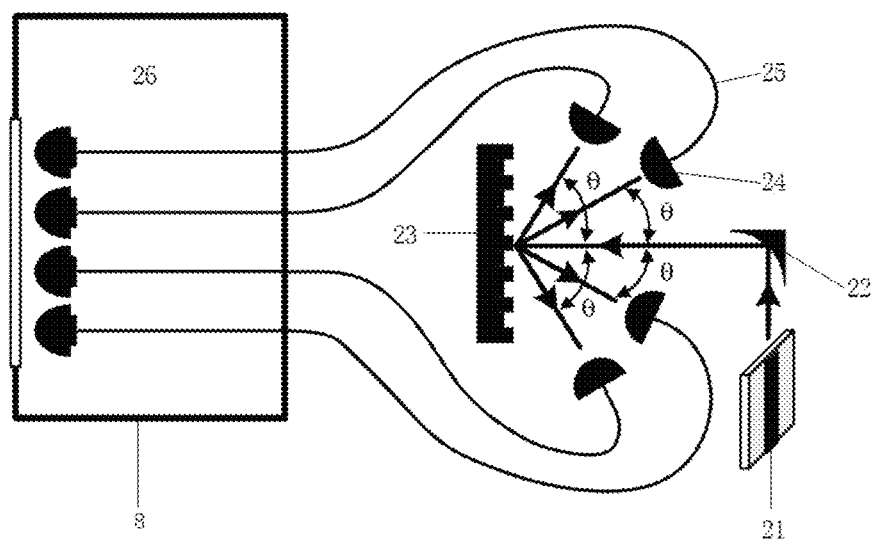
FIG. 2 is a schematic diagram showing the principle of the mid- and far-infrared local oscillator signal source distribution and coupling system of the present invention.

As shown in FIG. 2, the mid- and far-infrared local oscillator signal source distribution and coupling system includes the quantum cascade laser 21, the off-axis parabolic mirror 22, the echelle grating 23 and the fiber coupler 24. The 2×2 pixel mid- and far-infrared superconducting HEB mixer 4 is the four-pixel superconducting HEB mixer array 26 composed of four mid- and far-infrared superconducting HEB detectors. The working principle of the mid- and far-infrared local oscillator signal source distribution and coupling system is that the local oscillator signal is generated by the quantum cascade laser 21 and is reflected by the off-axis parabolic mirror 22 and then focused on the surface of the echelle grating 23. The echelle grating 23 reflects and separates the incident local oscillator signal into four 2×2 reflected signals by adjusting the wavefront phase of the reflected signal. Subsequently, the four beams of the reflected local oscillator signals are coupled to the end face of the mid- and far-infrared optical fiber 25 by using the fiber coupler 24 composed of a parabolic mirror. The local oscillator signal is transmitted by the optical fiber to the side of the superconducting HEB mixer chip in the 4K closed-cycle cryostat 8.

Figure 3:
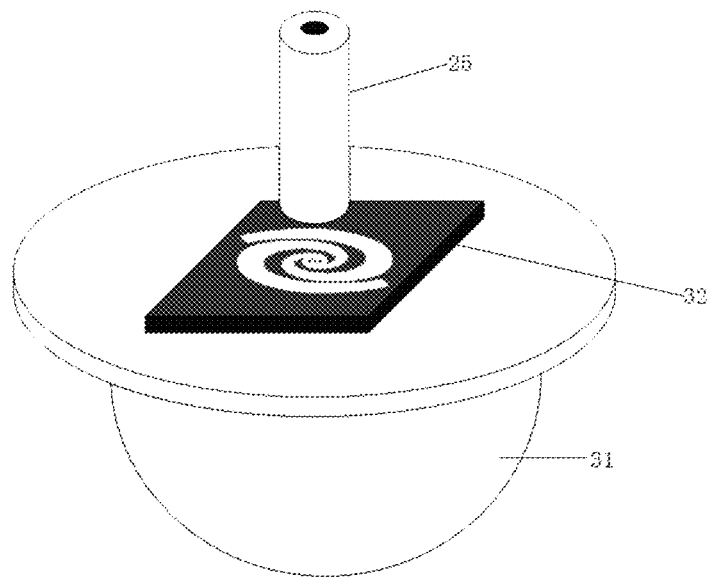
FIG. 3 is a schematic diagram showing the principle of a signal coupling between the optical fiber and the superconducting HEB mixer in the present invention.

As shown in FIG. 3, the 2×2 pixel mid- and far-infrared superconducting HEB mixer 4 includes the super hemispherical lens 31 and the mid- and far-infrared superconducting HEB mixer chip 32. The local oscillator signal is transmitted via the mid- and far-infrared optical fiber 25 to the side of the mid- and far-infrared superconducting HEB mixer chip 32 in the 4K closed-cycle cryostat 8. As a mechanical structure, the superconducting HEB mixing cavity ensures that the distance between the end face of the optical fiber and the mixer chip is less than 1 mm. The alignment error between the center of the optical fiber and the superconducting HEB mixer is less than 0.1 mm. The local oscillator signal is coupled to the superconducting HEB mixer via the free space from the end face of the optical fiber to realize efficient local oscillator signal coupling.

The steps of performing a coherent detection by the grating- and fiber-coupled multi-beam coherent receiving system in a mid- and far-infrared band in FIG. 1 are as follows.

1. The detection signal is coupled to the mid- and far-infrared superconducting HEB mixer chip 32 by the super hemispherical lens 31, and is mixed with the local oscillator signal by the mid- and far-infrared superconducting HEB mixer chip 32 to obtain an intermediate frequency signal. The intermediate frequency signal concurrently retains the frequency and amplitude information of the original signal. The 2×2 pixel mid- and far-infrared superconducting HEB mixer 4 generates a total of four intermediate frequency signals.

2. The four intermediate frequency signals are first amplified by the multi-channel cryogenic low-noise amplifier 6, and then subjected to high-resolution spectrum processing by the room-temperature intermediate-frequency and high-resolution spectrum processing unit 7, thereby completing the signal coherent detection of the multi-beam superconducting receiving system in the sub-millimeter band, that is, narrow-band high-resolution signal spectrum analysis.

The steps of performing the mid- and far-infrared local oscillator signal distribution and coupling in FIG. 2 are as follows.

1. The local oscillator signal is generated by the quantum cascade laser 21, and is reflected by the off-axis parabolic mirror 22 and then focused on the surface of the echelle grating 23.

2. The echelle grating 23 reflects and separates the incident local oscillator signal into four reflected signals with a 2×2 array.

3. The fiber coupler 24 composed of the parabolic mirror is used to couple the reflected signals to the end face of the mid- and far-infrared optical fiber 25.

4. Through an optical fiber transmission, the local oscillator signal is coupled to the side of the mid- and far-infrared superconducting HEB mixer chip 32 to realize efficient local oscillator distribution and coupling.

It should be noted that the terms such as "upper", "lower", "left", "right", "front", "rear", etc., used in this application are only for clarity of description, not for limiting the scope of the present invention. The change or adjustment of the mutual relationship without substantial technical content alteration shall be regarded as the scope of implementation of the present invention.

The above descriptions are only the preferred embodiments of the present invention, and the protection scope of the present invention is not limited to the above-mentioned embodiments. All technical solutions under the inventive concept of the present invention belong to the protection scope of the present invention. It should be noted that for those skilled in the art, several improvements and modifications without departing from the principle of the present invention should be regarded as the protection scope of the present invention.

What is claimed is:

1. A grating- and fiber-coupled multi-beam coherent receiving system in a mid- and far-infrared band, comprising: a mid- and far-infrared local oscillator signal source, a phase grating, a multi-beam fiber coupling system, a 2×2 pixel mid- and far-infrared superconducting HEB mixer, a multi-channel DC bias source, a multi-channel cryogenic low-noise amplifier and a room-temperature intermediate-frequency and high-resolution spectrum processing unit; wherein the mid- and far-infrared local oscillator signal source generates a local oscillator signal, and the local oscillator signal is incident and focused on a surface of the phase grating;

the phase grating reflects and separates the local oscillator signal into four reflected local oscillator signals with a 2×2 array; the four reflected local oscillator signals are coupled to an end face of an optical fiber through the multi-beam fiber coupling system, and then the four reflected local oscillator signals are transmitted to a side of the 2×2 pixel mid- and far-infrared superconducting HEB mixer in a cryogenic Dewar via the optical fiber to realize a distribution and a coupling of the local oscillator signal;

a detection signal and the local oscillator signal are mixed by the 2×2 pixel mid- and far-infrared superconducting HEB mixer to generate four intermediate frequency signals the four intermediate frequency signals are first amplified by the multi-channel cryogenic low-noise amplifier, and then the four intermediate frequency signals are subjected to a high-resolution spectrum processing by the room-temperature intermediate-frequency and high-resolution spectrum processing unit; and the multi-channel DC bias source is connected to the 2×2 pixel mid- and far-infrared superconducting HEB mixer, and the multi-channel DC bias source is used to provide a DC bias to the 2×2 pixel mid- and far-infrared superconducting HEB mixer.

2. The grating- and fiber-coupled multi-beam coherent receiving system in the mid- and far-infrared band according to claim 1, wherein the 2×2 pixel mid- and far-infrared superconducting HEB mixer and the multi-channel cryogenic low-noise amplifier are located in a 4K closed-cycle cryostat.

3. The grating- and fiber-coupled multi-beam coherent receiving system in the mid- and far-infrared band according to claim 1, wherein the mid- and far-infrared local oscillator signal source comprises a quantum cascade laser and an off-axis parabolic mirror, wherein the quantum cascade laser generates the local oscillator signal, the local oscillator signal is reflected by the off-axis parabolic mirror, and then the local oscillator signal is focused on the surface of the phase grating.

4. The grating- and fiber-coupled multi-beam coherent receiving system in the mid- and far-infrared band according to claim 3, wherein the phase grating adopts an echelle grating; the local oscillator signal is reflected by the off-axis parabolic mirror, and then the local oscillator signal is incident and focused on a surface of the echelle grating; the echelle grating reflects and separates the local oscillator signal into the four reflected local oscillator signals with the 2×2 array by adjusting a wavefront phase of a reflected signal.

5. The grating- and fiber-coupled multi-beam coherent receiving system in the mid- and far-infrared band according to claim 4, wherein the multi-beam fiber coupling system comprises a fiber coupler and a mid- and far-infrared optical fiber, and the four reflected local oscillator signals are coupled to an end face of the mid- and far-infrared optical fiber through the fiber coupler, wherein the fiber coupler is composed of a parabolic mirror.

6. The grating- and fiber-coupled multi-beam coherent receiving system in the mid- and far-infrared band according to claim 5, wherein the 2×2 pixel mid- and far-infrared superconducting HEB mixer is a four-pixel superconducting HEB mixer array composed of four mid- and far-infrared superconducting HEB detectors; the 2×2 pixel mid- and far-infrared superconducting HEB mixer comprises a super hemispherical lens and a mid- and far-infrared superconducting HEB mixer chip; the detection signal is coupled to the mid- and far-infrared superconducting HEB mixer chip by the super hemispherical lens, and the local oscillator signal is coupled to the mid- and far-infrared superconducting HEB mixer chip from the end face of the mid- and far-infrared optical fiber through a free space; and a distance between the end face of the mid- and far-infrared optical fiber and the mid- and far-infrared superconducting HEB mixer chip is less than 1 mm.

7. The grating- and fiber-coupled multi-beam coherent receiving system in the mid- and far-infrared band according to claim 4, wherein the echelle grating uses a Si substrate to perform a multilayer deep silicon etching, and the echelle grating uses an evaporated gold coating as a reflective multi-beam echelle grating.

8. The grating- and fiber-coupled multi-beam coherent receiving system in the mid- and far-infrared band according to claim 5, wherein the mid- and far-infrared optical fiber adopts a polycrystalline fiber, and the polycrystalline fiber works in a 4 k temperature zone.

\* \* \* \* \*